United States Patent [19]
Koshikawa

[11] Patent Number: 5,781,499
[45] Date of Patent: Jul. 14, 1998

[54] SEMICONDUCTOR MEMORY DEVICE

[75] Inventor: Yasuji Koshikawa, Tokyo, Japan

[73] Assignee: NEC Corporation, Tokyo, Japan

[21] Appl. No.: 741,285

[22] Filed: Oct. 30, 1996

[30] Foreign Application Priority Data

Nov. 10, 1995  [JP]  Japan .................. 7-292919

[51] Int. Cl.⁶ .................................................. G11C 8/00
[52] U.S. Cl. ...................... 365/233; 365/189.04; 365/194
[58] Field of Search .................... 365/189.04, 189.05, 365/233, 194

[56] References Cited

U.S. PATENT DOCUMENTS 5,539,693  7/1996  Koshikawa et al. ............. 365/233
5,555,524  9/1996  Castellano ....................... 365/233
5,557,581  9/1996  D'Souza .......................... 365/233

FOREIGN PATENT DOCUMENTS

61-148692  7/1986  Japan .
6-76566    3/1994  Japan .
8-96573    4/1996  Japan .

Primary Examiner—David C. Nelms
Assistant Examiner—F. Niranjan
Attorney, Agent, or Firm—Young & Thompson

[57] ABSTRACT

The semiconductor memory device of the present invention is provided with at least: a first sync-signal generation circuit that generates and outputs a first sync-signal synchronized with any of a first clock inputted from the outside and a second and third clock inputted after the first clock; a first delay circuit that delays the first sync-signal by a prescribed time interval and outputs the result as a second sync-signal; a first latch circuit that latches the second sync-signal; a second latch circuit that latches the first sync-signal; and a third latch circuit that detects that both the first and second latch circuits have latched the second sync-signal and the first sync-signal, respectively, and latches this detection; the output of the third latch circuit then being used to control a pipeline circuit.

12 Claims, 10 Drawing Sheets

SEMICONDUCTOR MEMORY DEVICE

BACKGROUND OF THE INVENTION

1. Field of the Invention

The present invention relates to a semiconductor memory device, and particularly to a pipeline control circuit of a semiconductor memory device that adopts an internal pipeline structure.

2. Description of the Related Art

With the increases in CPU speeds in recent years, the demand for higher-speed semiconductor memory devices has become more urgent. However, this demand has not been met due to physical limits to process miniaturization and the increase in chip size accompanying the trend to greater capacity. As one means of solving this problem, synchronous semiconductor memory devices having an internal pipeline structure have been proposed (For example, in Japanese Patent Laid-open No. 148692/86 (Memory Devices), Japanese Patent Laid-open No. 67795/92 (Semiconductor Memory Device), and Japanese Patent Laid-open No. 232732/94 (Semiconductor Memory Device)).

Figure 1:
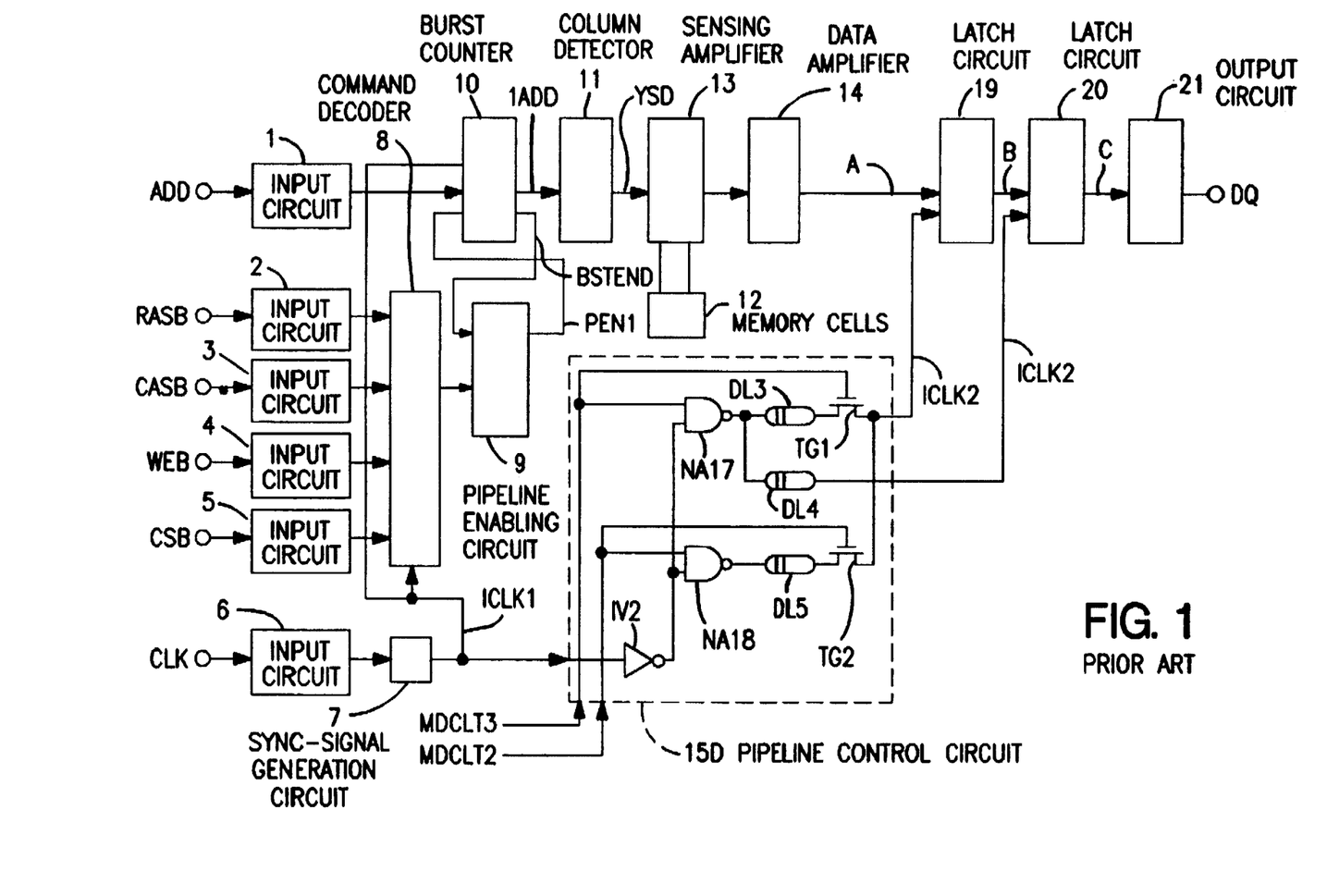
FIG. 1 is a circuit diagram of an example of a semiconductor memory device of the prior art.
Figure 2A:
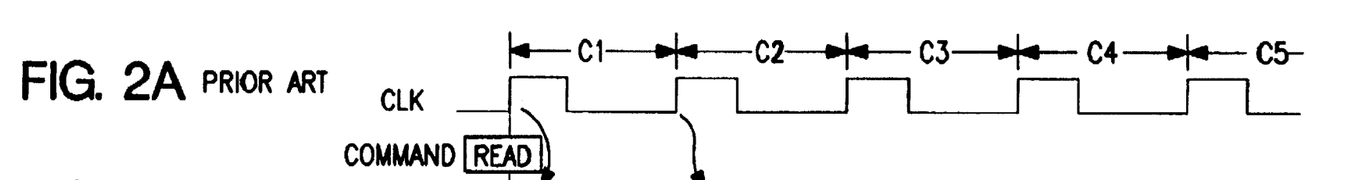
FIGS. 2A–2J are waveform charts illustrating the operation of the prior-art example shown in FIG. 1
Figure 2B:
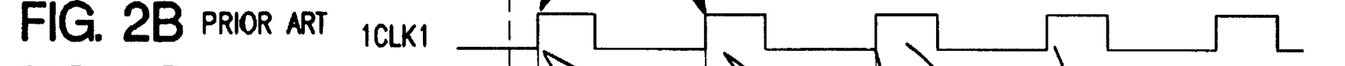
Figure 2C:
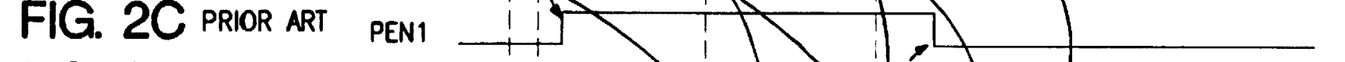
Figure 2D:
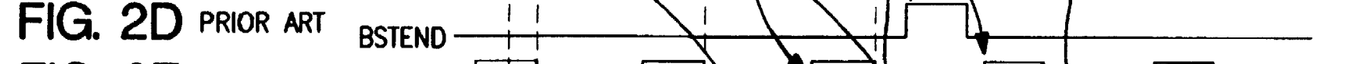
Figure 2E:
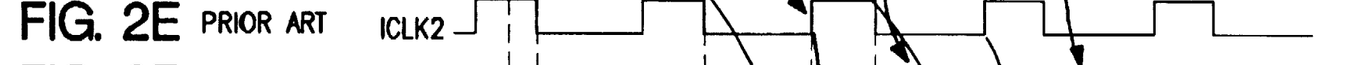
Figure 2F:
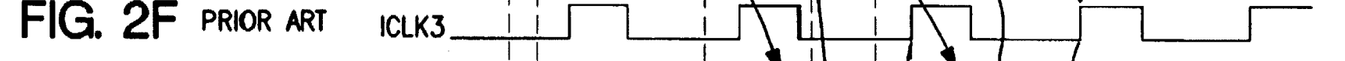
Figure 2G:
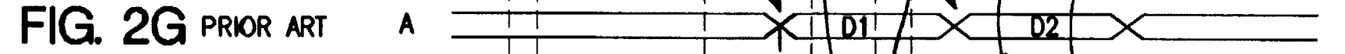
Figure 2H:
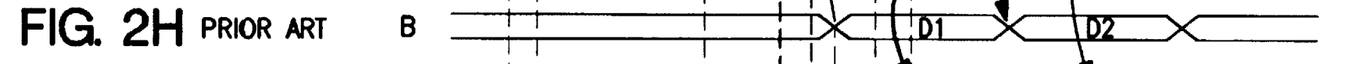
Figure 2I:
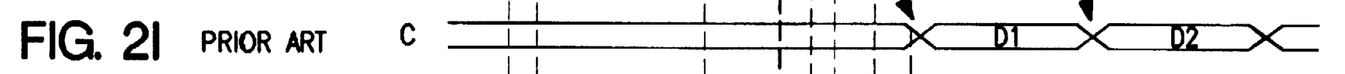
Figure 2J:
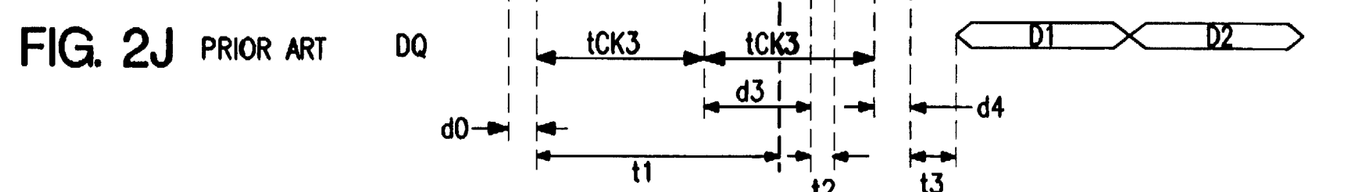
Figure 3A:
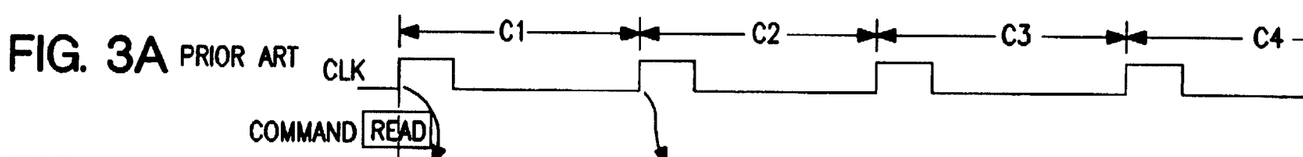
FIG. 3A–3J are waveform charts illustrating the operation of the prior-art example shown in FIG. 1.
Figure 3B:
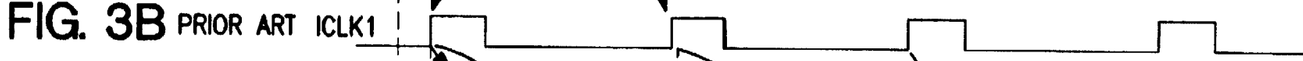
Figure 3C:
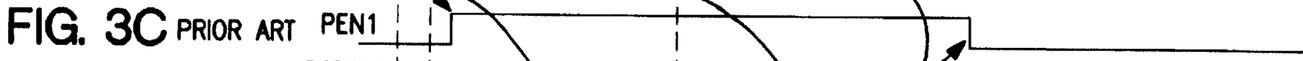
Figure 3D:
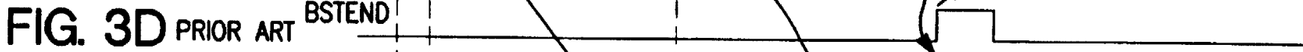
Figure 3E:
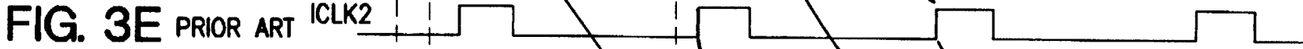
Figure 3F:
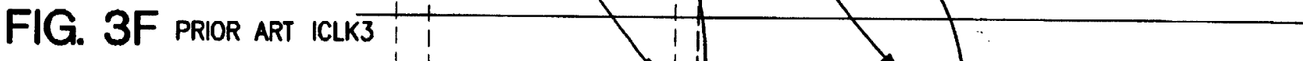
Figure 3G:
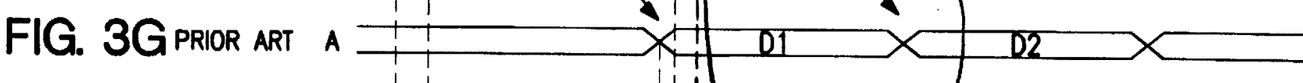
Figure 3H:
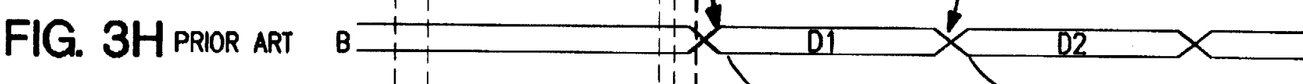
Figure 3I:
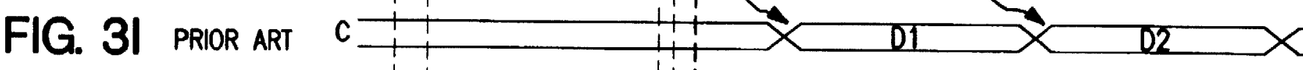
Figure 3J:
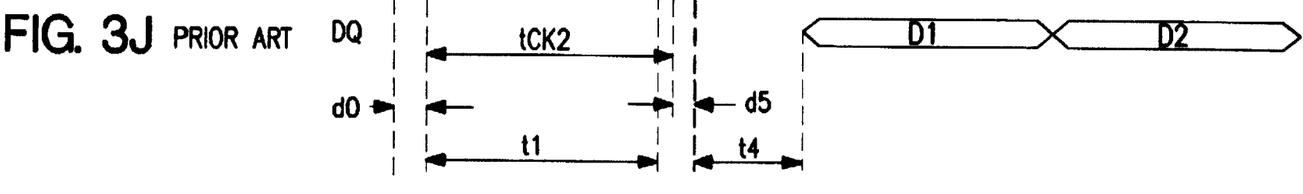

FIG. 1 is a circuit diagram showing one example of a semiconductor memory device of the prior art. This prior-art semiconductor memory device is constructed from:

- a plurality of input circuits 1 having address terminals ADD;
- a plurality of input circuits 2–5 having input terminals RASB, CASB, WEB, CSB, respectively;
- input circuit 6 having an external clock signal CLK;
- sync-signal generation circuit 7 (first sync-signal generation circuit) that inputs the output of input circuit 6 and outputs sync-signal ICLK1 (first sync-signal);
- command decoder 8 that inputs the output of input circuits 2–5, and outputs the result in synchronization with sync-signal ICLK1;
- pipeline enabling circuit 9 that inputs the output of command decoder 8 and the burst end signal BSTEND and outputs pipeline enable signal PEN1;
- burst counter 10 that inputs the output of input circuit 1, pipeline enable signal PEN1, and internal sync-signal ICLK1, and outputs internal address signal IADD and burst end signal BSTEND;
- column decoder 11 that inputs a plurality of internal address signals IADD and outputs a plurality of column selection lines YSW;
- a plurality of memory cells 12;
- a plurality of sensing amplifiers 13 that input column selection lines YSW and amplifies the data of memory cells 12;
- data amplifier 14 that amplifies the output data of sensing amplifier 13 and outputs to node A;
- pipeline control circuit 15D that inputs sync-signal ICLK1 and mode signals MDCLT2 and MDCLT3 and outputs sync-signals ICLK2 and ICLK3;
- latch circuit 19 that inputs the output of data amplifier 14, and outputs data to node B in synchronization with sync-signal ICLK2;
- latch circuit 20 that inputs the output of latch circuit 19, and outputs data-to node C in synchronization with sync-signal ICLK3; and
- output circuit 21 that inputs the output of latch circuit 20 and outputs data to output terminal DQ. In FIG. 1, only one of each of input circuits 1, sensing amplifiers 13, memory cells 12, IADD, and YSW is shown.

Pipeline control circuit 15D is further constructed from:
inverter IV2 that inputs sync-signal ICLK1;

- NAND gate NA17 that inputs mode signal MDCLT3 and the output of inverter IV2;
- NAND gate NA18 that inputs mode signal MDCLT2 and the output of inverter IV2;
- delay circuit DL3 that inputs the output of NAND gate NA17;
- delay circuit DL5 that inputs the output of NAND gate NA18;
- transfer gate TG1 that inputs the output of delay circuit DL3, inputs mode signal MDCLT3 to its gate, and outputs sync-signal ICLK2;
- transfer gate TG2 that inputs the output of delay circuit DL5, inputs mode signal MDCLT 2 to its gate, and outputs sync-signal ICLK2; and
- delay circuit DL4 that inputs the output of NAND gate NA17 and outputs sync-signal ICLK3.

The operation of this example of the prior art will next be explained with reference to FIGS. 2A–2J, which are operating waveform charts illustrating the operation of the example shown in FIG. 1. In this waveform chart, CAS latency=3.

CAS latency indicates how many clock cycles are required from the input of a read command from the outside until data are outputted to an output terminal, 3 cycles being necessary when CAS latency=3. Here, mode signal MDCLT3 is set to a high level and MDCLT2 is set to a low level.

If the input levels are set such that each of input terminals RASB, CASB, WEB, and CSB becomes a read command at the rise of external clock CLK at cycle C1, pipeline enable signal PEN1 will become high-level in accordance with sync-signal ICLK1, which becomes high-level upon receiving external clock CLK.

When a read command is inputted, internal addresses are generated at burst counter 10 for exactly an independently set "burst length." "Burst length" indicates the number of bits to be read out in accordance with one read command input and is set before cycle C1 in the figure. This example illustrates a case in which burst length is set to "2."

When burst-length (2-bit) internal addresses are generated at cycles C1 and C2, a high-level pulse is generated at burst end signal BSTEND in response to the high level of sync-signal ICLK1 of cycle C3, and pipeline enable signal PEN1 accordingly becomes low-level.

Sync-signal ICLK1 is generated with a delay of interval d0 from external clock CLK, sync-signal ICLK2 is generated with a delay of interval d3 from sync-signal ICLK1, and sync-signal ICLK3 is generated with a delay of interval d4 from sync-signal ICLK1.

When sync-signal ICLK1 becomes high-level at cycle C1, internal addresses are generated at burst counter 10, and read data D1 of the corresponding addresses reaches node A after time interval t1, and in succession, when sync-signal ICLK2 becomes high-level, read data D1 is outputted from latch circuit 19 and reaches node B after time interval t2. Further, when sync-signal ICLK3 becomes high-level, read data D1 is outputted from latch circuit 20, and after time interval t3, read data D1 passes through node C and is outputted to output terminal DQ.

In addition, when sync-signal ICLK1 becomes high-level at cycle C2, second-bit read data D2 is similarly read out.

Here, if the cycle Lime is tCK3 to latch read data D1 and D2 in latch circuit 19, the delay time of delay element DL3 that is to determine time interval d3 must be set such that time interval t1 is:

$$t1 < tCK3 + d3 \qquad (1)$$

and in order to latch read data D1 and D2 in latch circuit 20, the delay time of delay element DL4 that is to determine time interval d4 must be set such that time interval t2 is:

$$d3 + t2 < tCK3 + d4 \qquad (2)$$

Further, because read data D1 must be outputted to output terminal DQ within three cycles from the read command, the following equation must be satisfied:

$$d0 + t1 + t2 + t3 < 3 \times tCK3 \qquad (3)$$

FIG. 3 is a waveform chart illustrating the operation of the example shown in FIG. 1, and in this operation waveform chart, CAS latency=2. Here, mode signal MDCLT3 is set to low-level and MDCLT2 is set to high-level.

Because mode signal MDCLT 3 is low-level, sync-signal ICLK3 is constantly high-level, and read data pass through latch circuit 20 without being latched.

Consequently, when sync-signal ICLK1 becomes high-level at cycle C1, an internal address is generated at burst counter 10 and read data D1 of that address reaches node A after time interval t1. Then, when sync-signal ICLK2 becomes high-level, read data D1 is outputted from latch circuit 19, and after a time interval t4, passes by way of node B and node C and is outputted to output terminal DQ.

When sync-signal ICLK1 becomes high-level at cycle C2, the second-bit read data D2 is similarly read out.

Here, if the cycle time is made tCK2 in order to latch read data D1 and D2 at latch circuit 19, the delay time of delay element DL5 that is to determine time d5 must be set such that time interval t1:

$$t1 < tCK2 + d5 \qquad (4)$$

Furthermore, because read data D1 must be outputted to output terminal DQ within two cycles from the read command, the following equation must be satisfied:

$$d0 + t1 + t4 < 2 \times tCK2 \qquad (5)$$

In this example, in order to effect operation with cycle time tCK3 at a minimum, values may be established based on equation (1):

$$d3 = t1 - tCK3 \qquad (6)$$

based on equation (2):

$$d4 = d3 + t2 - tCK3 \qquad (7)$$

$$\therefore d4 = t1 + t2 - 2 \times tCK3 \qquad (7)'$$

and based on equation (3):

$$tCK3 = (d0 + t1 + t2 + t3)/3 \qquad (8)$$

Consequently, the optimum values of time intervals t3 and t4 can be established by substituting equation (8) for equations (6) and (7)':

$$d3 = t1 - (d0 + t1 + t2 + t3)/3 \qquad (9)$$

$$d4 = t1 + t2 - 2 \times (d0 + t1 + t2 + t3)/3 \qquad (10)$$

and the delay times of delay elements DL3 and DL4 may be set to satisfy these equations.

In order to effect operation with cycle time tCK2 at a minimum in this example, values may be established based on equation (4):

$$d5 = t1 - tCK2 \qquad (11)$$

and based equation (5):

$$tCK2 = (d0 + t1 + t4)/2 \qquad (12)$$

The optimum value of time interval d5 is defined by substituting equation (12) for equation (11):

$$d5 = t1 - (d0 + t1 + t4)/2$$

and the delay time of delay element DL5 may be set such to satisfy this equation.

The delay times of delay elements DL3, DL4, DL5 can be optimized in the design stage using simulations, but in most cases, delay times can also be adjusted through a wiring process having a wide range of diffusion.

In addition, because time intervals d3, d4 and d5 can only be positive values, latch circuits 19 and 20 are arranged to be as close in time as possible to terminal DQ in order to satisfy equations (1), (2), and (4).

With these prior-art semiconductor memory devices, there has been the drawback that, in order to minimize cycle time (tCK3) of CAS latency=3, the delay times of delay elements DL3 and DL4 must be optimized, and to minimize cycle time (tCK2) of CAS latency=2, the delay time of delay element DL5 and the delay times of separate delay elements for each CAS latency must be optimized, and this results in an increase of design items as well as an increase in items for adjustment when initiating use of manufactured products.

With the current and future development of products having a "CAS latency=4" function, the delay times of three delay elements must be optimized and adjusted, and with the development of higher-speed semiconductor memory devices, the above-described problems become even more significant.

SUMMARY OF THE INVENTION

The object of the present invention is to provide a semiconductor memory device in which the delay times of separate delay elements for each "CAS latency" need not be optimized.

To achieve the above-described object, a semiconductor memory device according to the present invention is provided with at least: a first sync-signal generation circuit that generates and outputs a first sync-signal in synchronization with any of a first clock inputted from the outside and a second and third clock inputted following the first clock; a first delay circuit that delays the first sync-signal a prescribed time interval and outputs [the result] as a second sync-signal; a first latch circuit that latches the second sync-signal; a second latch circuit that latches the first sync-signal; a third latch circuit that detects that first and second latch circuits both latch a second sync-signal and first sync-signal, respectively, and latches this detection; and controls a pipeline circuit by the output of the third latch circuit.

For the timing of pipeline control, the present invention uses the output of third latch circuit which indicates the generation of both the output of the first latch circuit that latches the generation of the second sync-signal that is regulated by the first delay circuit which regulates the minimum necessary time of the data transfer path, and the output of the second latch circuit that latches the first sync-signal produced at the first sync-signal generation circuit from clocks (CLK). In other words, the slower of the output of the first latch circuit and the output of the second latch circuit is used as the timing of the pipeline control.

The third latch circuit detects that both the first and second latch circuits have latched the second sync-signal and first sync-signal, respectively, and then is reset.

The semiconductor memory device of the present invention is further provided with a first control signal generation circuit that outputs a first control signal that is enabled after completion of generation of the first sync-signal, which is generated in synchronization with the first clock, and first and second latch circuits respectively latch second and first sync-signals only after the first control signal is enabled.

This construction is adopted to prevent the second latch circuit from entering a latched state at the first clock (latching occurs for the second and subsequent clocks).

In addition, a semiconductor memory device according to the present invention is further provided with: a second delay circuit that delays by a prescribed time interval the output of the third latch circuit and outputs the result as a third sync-signal; a fourth latch circuit that latches the third sync-signal; a fifth latch circuit that latches the first sync-signal that is generated in synchronization with the third clock; and a sixth latch circuit that detects that the fourth and fifth latch circuit have both latched third sync-signal and first sync-signal, respectively, and latches this detection; and controls a pipeline circuit by the output of the sixth latch circuit.

For the timing of pipeline control, the present invention uses the output of a sixth latch circuit which indicates the generation of both the output of the fourth latch circuit that latches the generation of the third sync-signal that is regulated by the second delay circuit which regulates the minimum necessary time of the data transfer path, and the output of the fifth latch circuit that latches the first sync-signal produced at the first sync-signal generation circuit from clocks (CLK). In other words, the slower of the output of the fourth latch circuit and the output of the fifth latch circuit is used as the timing of the pipeline control.

The sixth latch circuit detects that both of the fourth and fifth latch circuits have latched the third sync-signal and first sync-signal, respectively, and then is reset.

The semiconductor memory device of the present invention is further provided with a second control signal generation circuit that outputs a second control signal that is enabled after completion of generation of the first sync-signal, which is generated in synchronization with the second clock, and fourth and fifth latch circuits respectively latch third and first sync-signals only after the second control signal is enabled.

In addition, a semiconductor memory device according to the present invention includes logic that, through operation mode, maintains the second or fourth latch circuits in the same state as generated by the sync-signal of the preceding stage.

In this way, changes in the CAS latency can be dealt with by only changing the level of the mode signal.

Latches of the first and second latch circuits are reset by the output of the third latch circuit.

Latches of the fourth and fifth latch circuits are reset by the output of the sixth latch circuit.

In addition, the semiconductor memory device of the present invention is further provided with a second sync-signal generation circuit that inputs the output of the third latch circuit and generates a fourth sync-signal, and this fourth sync-signal controls the pipeline circuit and resets the latches of the third latch circuit.

Finally, the semiconductor memory device of the present invention is further provided with a third sync-signal generation circuit that inputs the output of the sixth latch circuit and generates a fifth sync-signal, and this fifth sync-signal controls the pipeline circuit and resets the latches of the sixth latch circuit.

The above and other objects, features, and advantages of the present invention will become apparent from the following description with references to the accompanying drawings which illustrate examples of the present invention.

DETAILED DESCRIPTION OF THE PREFERRED EMBODIMENTS

Figure 4:
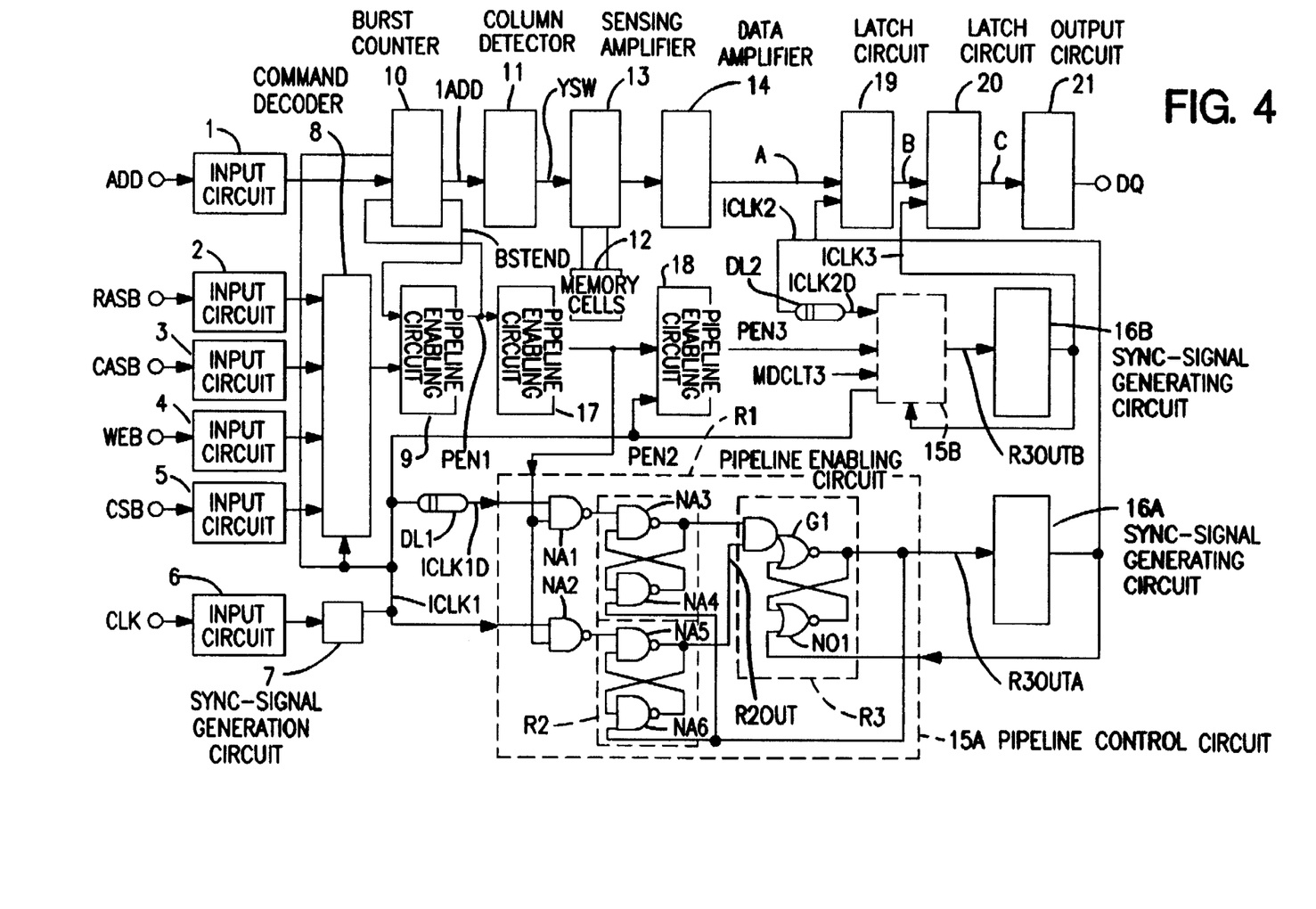
FIG. 4 is a circuit diagram showing the first embodiment of the semiconductor memory device of the present invention.

As shown in FIG. 4, the first embodiment of the semiconductor memory device is equivalent to the prior-art example of FIG. 1 to which have been added pipeline enable circuits 17 and 18, sync-signal generation circuits 16A and 16B, and delay elements DL1 (first delay circuit) and DL2 (second delay circuit); and in which pipeline control circuits 15A and 15B have been provided in place of pipeline control circuit 15D.

Pipeline enable circuit 17 (first control signal generation circuit) inputs pipeline enable signal PEN1 and outputs pipeline enable signal PEN2 synchronized to sync-signal ICLK1. Pipeline enable circuit 18 (second control signal generation circuit) inputs pipeline enable signal PEN2 and outputs pipeline enable signal PEN3 synchronized to sync-signal ICLK1. Delay element DL1 delays sync-signal ICLK1 (first sync-signal) a fixed time interval and outputs sync-signal ICLK1D (second sync-signal). Pipeline control circuit 15A inputs sync-signal ICLK1, ICLK1D, and ICLK2 and outputs output R30UTA. Sync-signal generation circuit 16A (second sync-signal generation circuit) inputs R3OUTA and outputs sync-signal ICLK2. Delay element DL2 delays sync-signal ICLK2 a fixed time interval and outputs sync-signal ICLK2D. Pipeline control circuit 15B inputs sync-signal ICLK1, ICLK2D, ICLK3 and mode signal MDCLT3, and outputs output R3OUTB. Sync-signal generation circuit 16B (third sync-signal generation circuit) inputs R3OUTB and outputs sync-signal ICLK3.

In addition, pipeline control circuit 15A is made up of: NAND gate NA1 which inputs sync-signal ICLK1D and pipeline enable signal PEN2; flip-flop R1 (first latch circuit) that is composed of two NAND gates NA3 and NA4 and that inputs the output of NAND gate NA1 and outputs R1OUT; NAND gate NA2 that inputs sync-signal ICLK1 and pipeline enable signal PEN2; flip-flop R2 (second latch circuit) composed of two NAND gates NA5 and NA6 and that inputs the output of NAND gate NA2 and outputs R2OUT; flip-flop R3 (third latch circuit) composed of composite gate G1 that inputs R1OUT and R2OUT; and NOR gate NO1 and flip-flops R1 and R2 are reset by the output R3OUTA, and flip-flop R3 is reset by sync-signal ICLK2.

Figure 5:
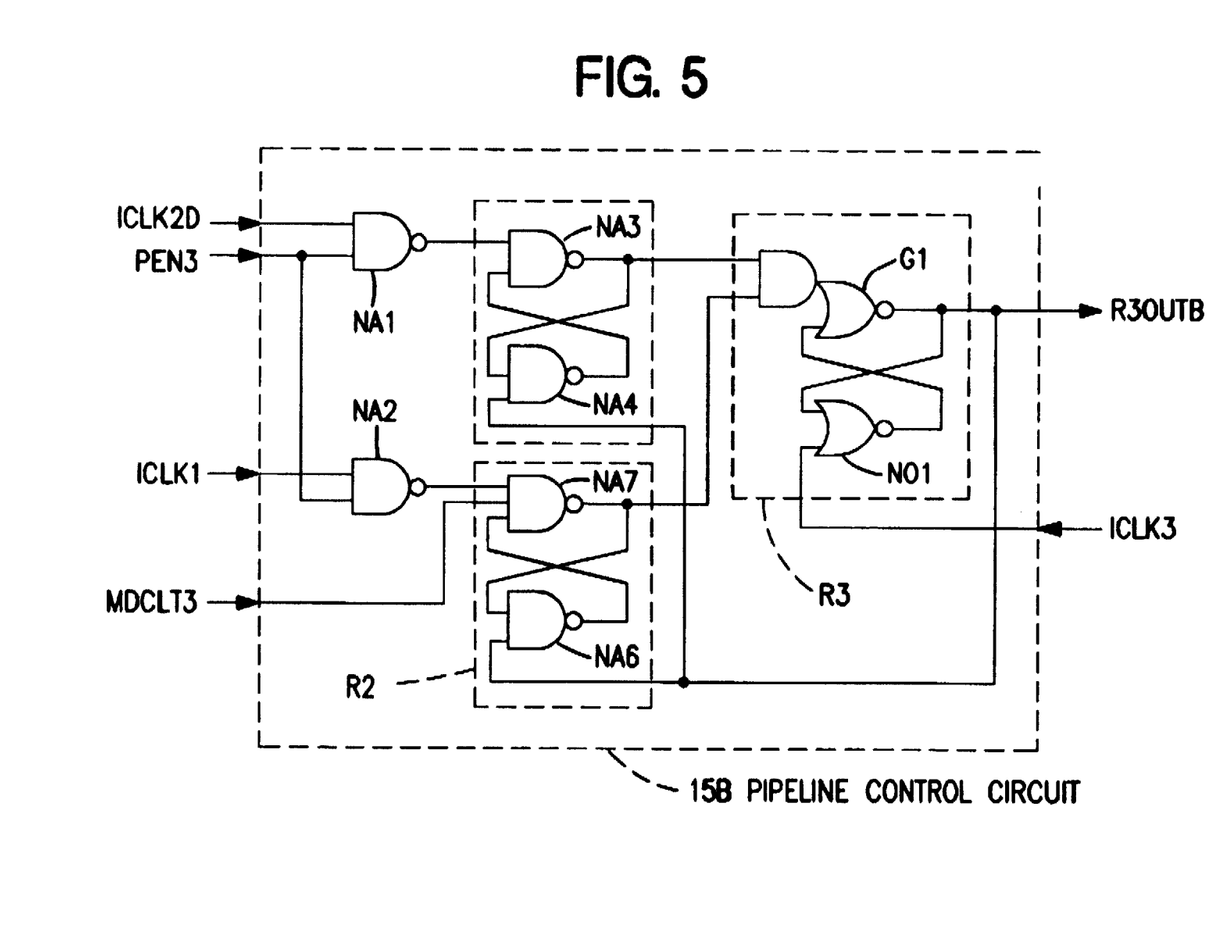
FIG. 5 is a circuit diagram of the pipeline control circuit 15B of the embodiment shown in FIG. 4.
Figure 6A:
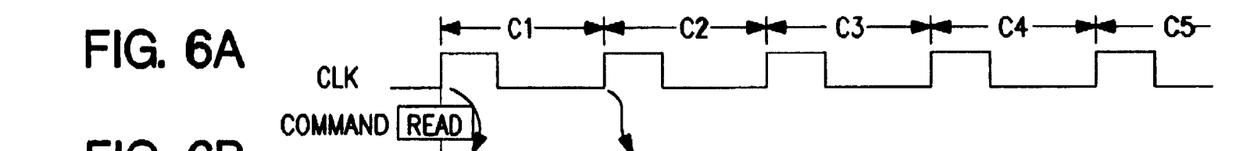
FIG. 6A–6L are waveform charts illustrating the operation of the embodiment shown in FIG. 4.
Figures 6B, 6C:
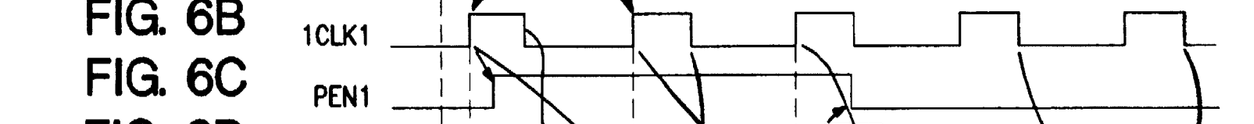
Figures 6D, 6E:
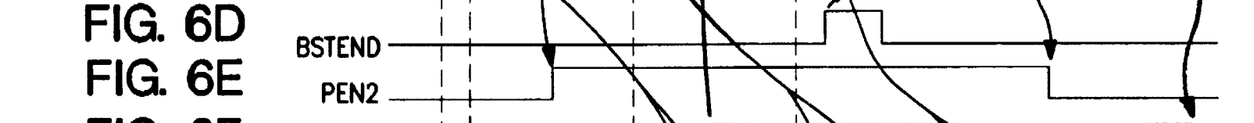
Figures 6F, 6G, 6H:
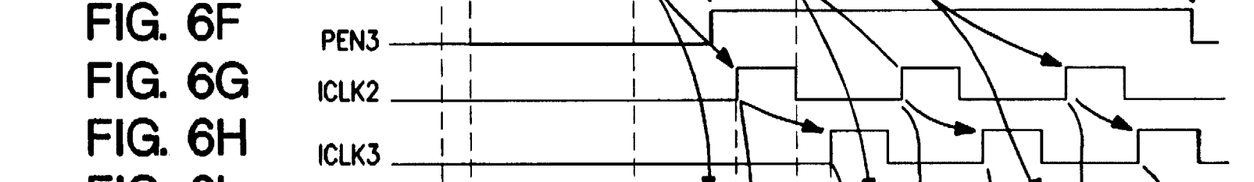
Figures 6I, 6J, 6K:
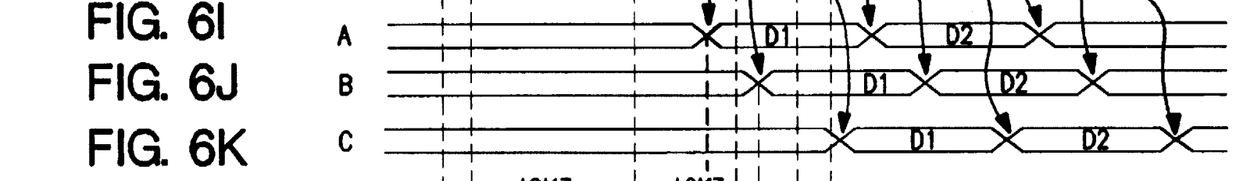
Figure 6L:
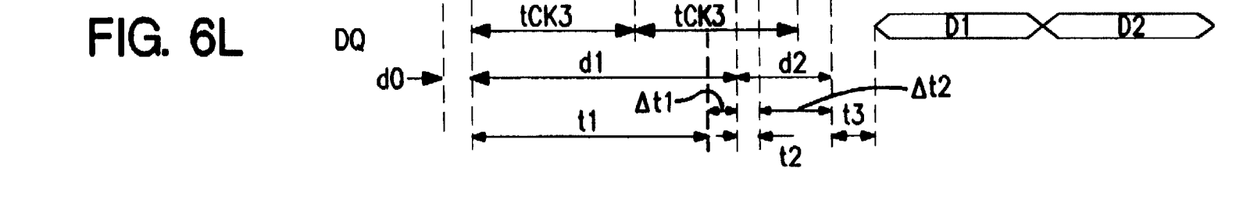
Figures 7A, 7B:
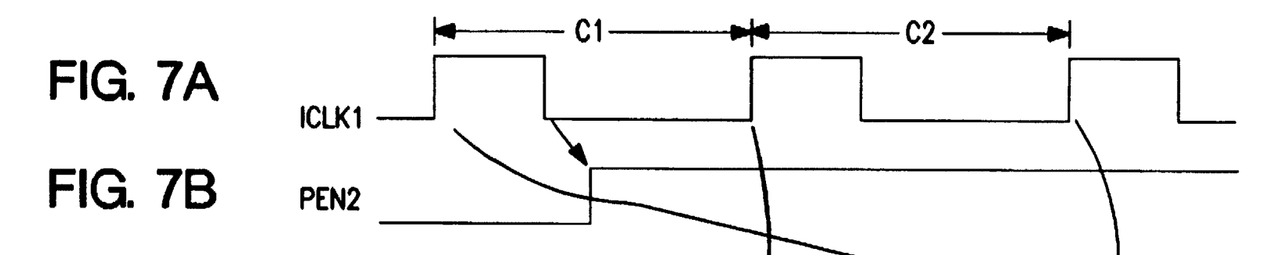
FIG. 7A–7G are waveform charts illustrating the operation of the embodiment shown in FIG. 4.
Figures 7C, 7D:
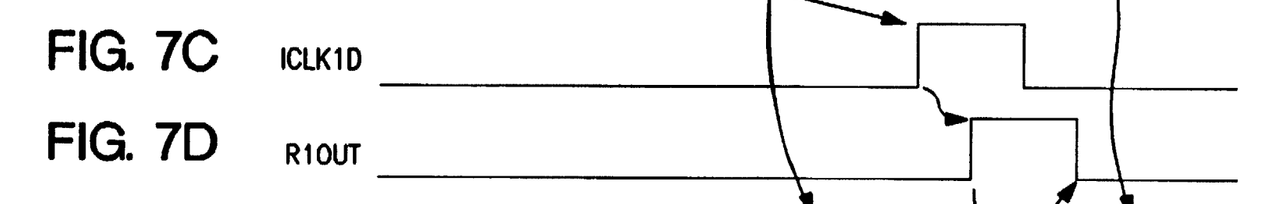
Figure 7E:
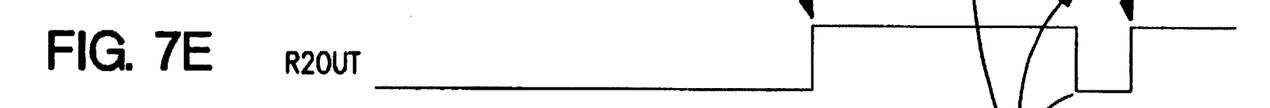
Figure 7F:
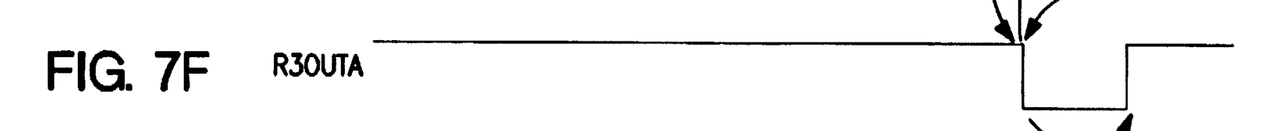
Figure 7G:
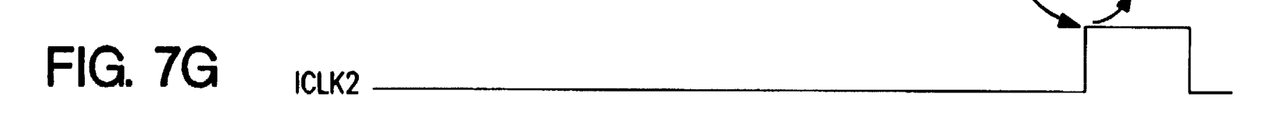
Figure 8A:
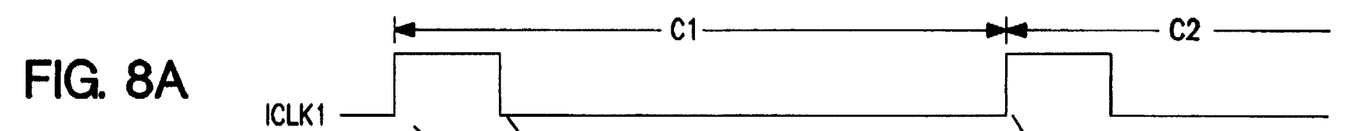
FIG. 8A–8G are waveform charts illustrating the operation of the embodiment shown in FIG. 4.
Figure 8B:
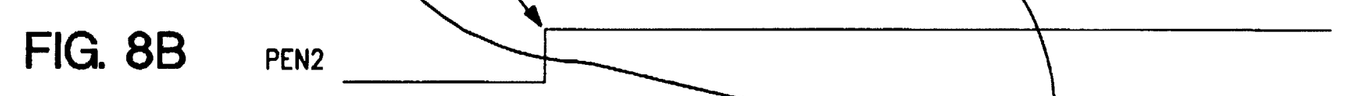
Figure 8C:
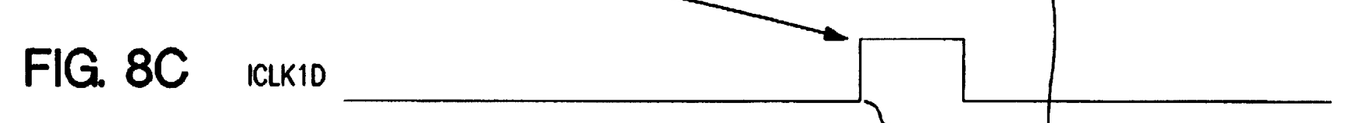
Figures 8D, 8E:
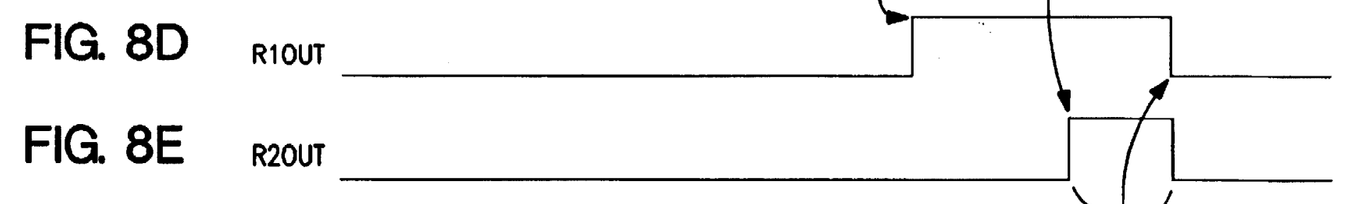
Figure 8F:
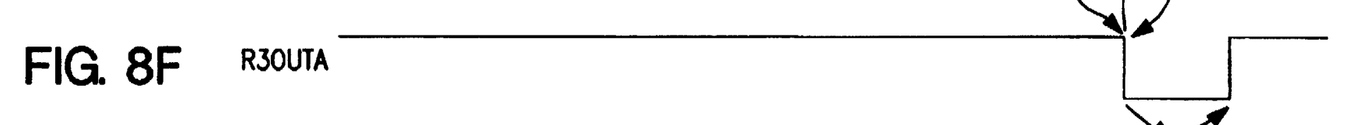
Figure 8G:
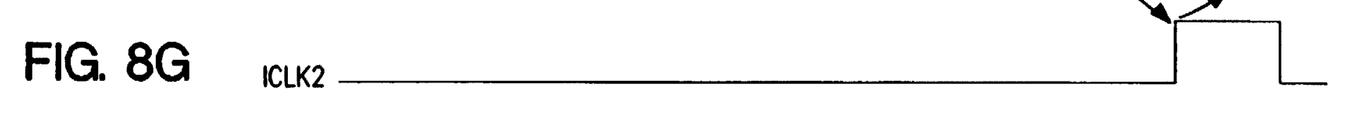

Further, as shown in FIG. 5, pipeline control circuit 15B is made up of: NAND gate NA1 that inputs sync-signal ICLK2D and pipeline enable signal PEN3; flip-flop R1 (fourth latch circuit) composed of two NAND gates NA3 and NA4 that inputs the output of NAND gate NA1 and outputs R1OUT; NAND gate NA2 that inputs sync-signal ICLK1 and pipeline enable signal PEN3; flip-flop R2 (fifth latch circuit) composed of two NAND gates NA7 and NA6 that inputs the output of NAND gate NA2 and mode signal MDCLT3 and that outputs R2OUT; and flip-flop R3 (sixth latch circuit) composed of compound gate G1 and NOR gate NO1 and that inputs R1OUT and R2OUT; flip-flop R1 and R2 being reset by output R3OUTB and flip-flop R3 being reset by sync-signal ICLK3.

The operation of this embodiment will next be explained with reference to FIGS. 6A–6L.

FIGS. 6A–6L are waveform charts illustrating the operation of the embodiment shown in FIG. 4 in which CAS latency=3. Mode signal MDCLT3 is set to high-level.

If the input level is set such that each of input terminals RASB, CASB, WEB, and CSB become a read command at the rise of cycle C1 of external clock CLK, pipeline enable signal PEN1 becomes high-level in response to sync-signal ICLK1, which becomes high-level with the reception of external clock CLK.

When burst-length (2-bit) internal addresses are generated at cycles C1 and C2, a high-level pulse is generated at burst end signal BSTEND due to the high level of sync-signal ICLK1 of cycle C3, and accordingly, pipeline enable signal PEN1 becomes low-level. After pipeline enable signal PEN1 becomes high-level, sync-signal ICLK1 transits from high-level to low-level and pipeline enable signal PEN2 thereupon becomes high-level; and after pipeline enable signal PEN1 becomes low-level, sync-signal ICLK1 transits from high-level to low-level and pipeline enable signal PEN2 thereupon becomes low-level. Further, after pipeline enable signal PEN2 becomes high-level, sync-signal ICLK1 transits from high-level to low-level and pipeline enable signal PEN3 thereupon becomes high-level; and after pipeline enable signal PEN2 becomes low-level, sync-signal ICLK I transits from high-level to low-level and pipeline enable signal PEN 3 thereupon becomes low-level.

As shown in FIGS. 7A–7G and FIGS. 8A–8G, after pipeline enable signal PEN2 becomes high-level, sync-signal ICLK1D and sync-signal ICLK1 transit from low-level to high-level, and the outputs R1OUT and R2OUT of flip-flops R1 and R2, respectively, are thereupon latched at high-level, and the output R3OUTA of pipeline control circuit 15A is also latched at high-level. Sync-signal ICLK2 is accordingly generated from sync-signal generation circuit 16A. In addition, when output R3OUTA becomes high-level, the outputs R1OUT of flip-flop R1 and R2OUT of flip-flop R2 are reset to low-level, and when sync-signal ICLK2 is generated, R3OUTA is also reset to low-level.

In addition, after pipeline enable signal PEN3 becomes high-level, sync-signal ICLK2D and sync-signal ICLK1 transit from low-level to high-level, whereupon sync-signal ICLK3 is similarly generated from sync-signal generation circuit 16B.

When sync-signal ICLK1 becomes high-level at cycle C1, an internal address is generated at burst counter 10, and the read data D1 of this address reaches node A after time interval t1. Next, when sync-signal ICLK2 becomes high-level, read data D1 is outputted from latch circuit 19 and reaches node B after time interval t2. Finally, when sync-signal ICLK3 becomes high-level, read data D1 is outputted from latch circuit 20 and is outputted from output terminal DQ by way of node C after time interval t3.

When sync-signal ICLK1 becomes high-level at cycle C2, the second-bit read data D2 is similarly read out.

FIGS. 7A–7G are waveform charts showing an example in which the cycle time is shorter. After pipeline enable signal PEN2 becomes high-level, the change of sync-signal ICLK1 to high-level precedes that of sync-signal ICLK1D. Consequently, sync-signal ICLK2 becomes high-level, and the timing at which read data reaches node B can be optimized by regulating the amount of delay of delay element DL1.

FIGS. 8A–8G, on the other hand, are waveform charts showing an example in which the cycle time is longer. After pipeline enable signal PEN2 becomes high-level, the change of sync-signal ICLK1D to high-level precedes that of sync-signal ICLK1. In other words, even though the read data reaches node A, it cannot reach node B unless the clock (CLK) of the next cycle is inputted and sync-signal ICLK1 is generated. When the cycle time is short, data can be sequentially outputted to terminal DQ even if data are transferred at an internal timing asynchronous to the clock (CLK), but when the cycle time is long, data must be held in two latch circuits to await input of a clock (CLK) before transferring data to the next stage to prevent cancelation of data by collisions between data of mixed cycles.

After pipeline enable signal PEN3 be comes high-level in a case in which CAS latency=3, if the cycle time is short, sync-signal ICLK1 becomes high-level before sync-signal ICLK2D and sync-signal ICLK3 becomes high-level, and therefore, the timing at which read data reaches node C can be optimized by adjusting the amount of delay of delay element DL2. However, if the cycle time is long, sync-signal ICLK2D becomes high level before sync-signal ICLK1 and sync-signal ICLK3 become high-level, and therefore, even though read data reaches node B, it cannot reach node C unless the clock (CLK) of the next cycle is inputted and sync-signal ICLK1 is generated. In a case in which CAS latency=2, mode signal MDCLT3 is low-level, an output high-level is always latched at flip-flop R2 within pipeline control circuit 15B, and the timing of sync-signal ICLK3 is determined only by the timing of sync-signal ICLK2D.

Here, to latch read data D1 and D2 in latch circuit 19, the delay time of delay element DL1 that is to determine time interval d1 should be set such that time interval t1:

$$t1 < d1 \qquad (13)$$

To latch read data D1 and D2 in latch circuit 20, the delay time of delay element DL2 that is to determine time d2 should be set such that time interval t2:

$$t2<d2 \quad (14)$$

Similarly, when CAS latency=2, to latch read data D1 and D2 in latch circuit 19, the delay time of delay element DL1 that is to determine time d1 should be set such that time interval t1:

$$t1<d1 \quad (13)'$$

Consequently, based on equations (13) and (14), to operate this example at the minimum cycle times tCK3 and tCK2, the delay times of delay elements DL1 and DL2 should be set so as to satisfy:

$$d1=t1 \quad (15)$$

$$d2=t2 \quad (16)$$

Figure 9:
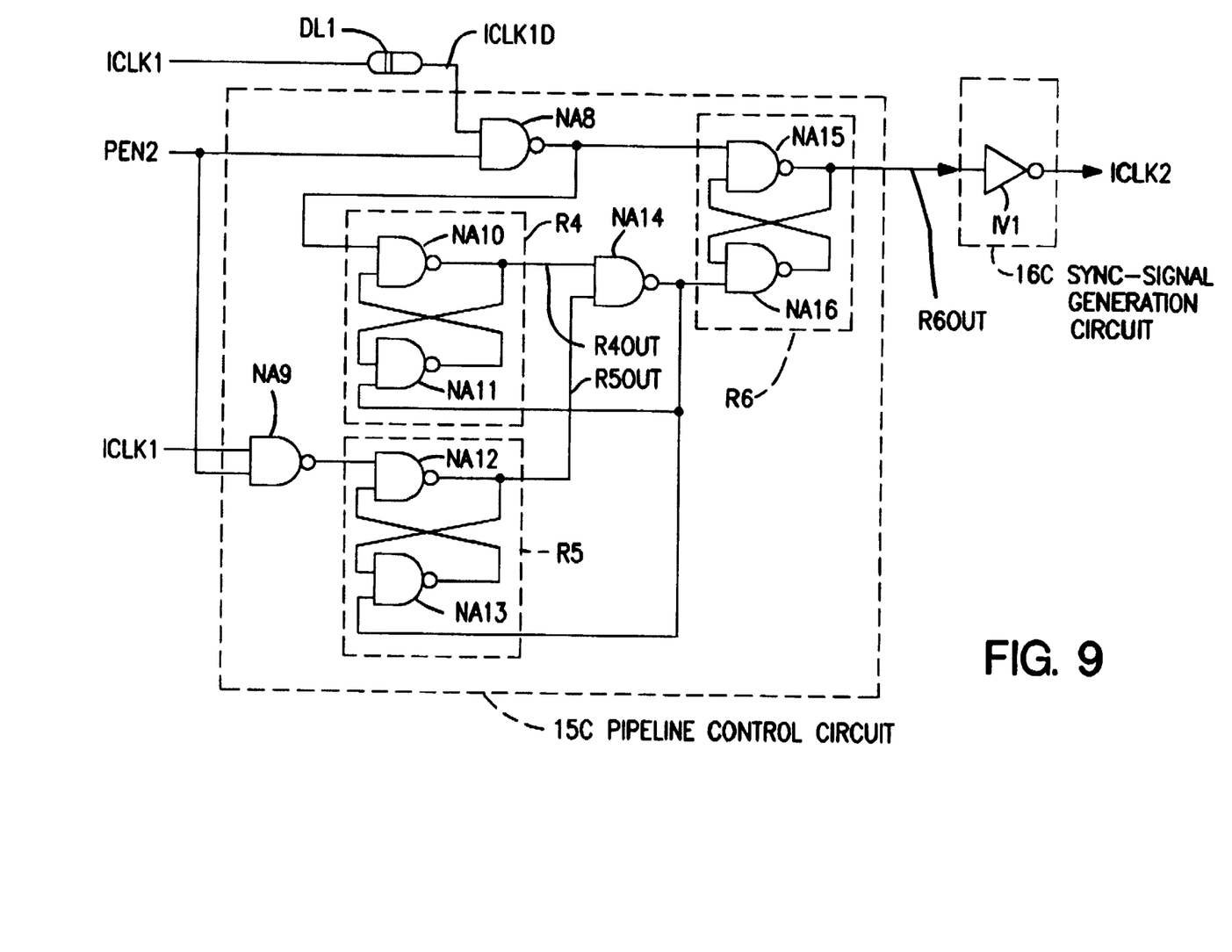
FIG. 9 is a circuit diagram of the second embodiment of the semiconductor memory device of the present invention.
Figure 10A:
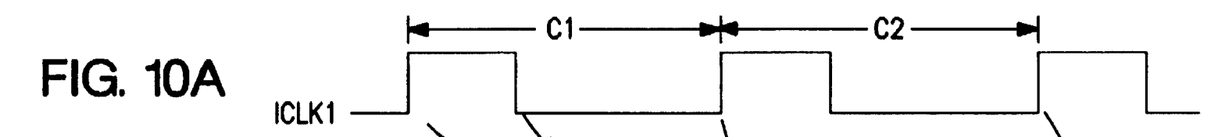
FIG. 10A–10H are waveform charts illustrating the operation of the embodiment shown in FIG. 9.
Figures 10B, 10C:
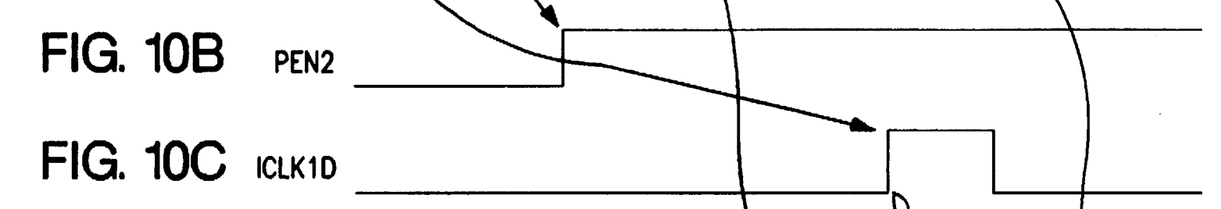
Figures 10D, 10E, 10F, 10G:
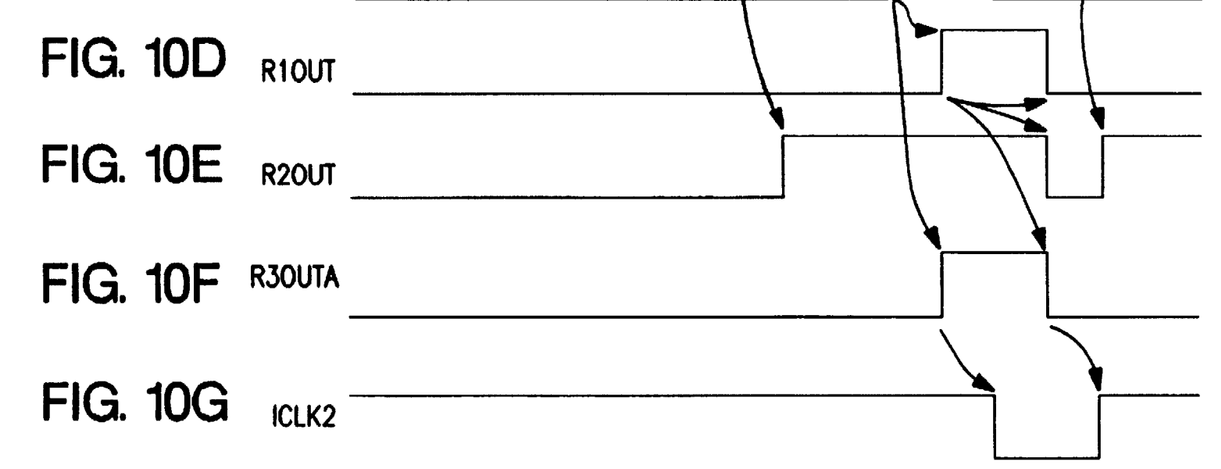
Figure 10H:
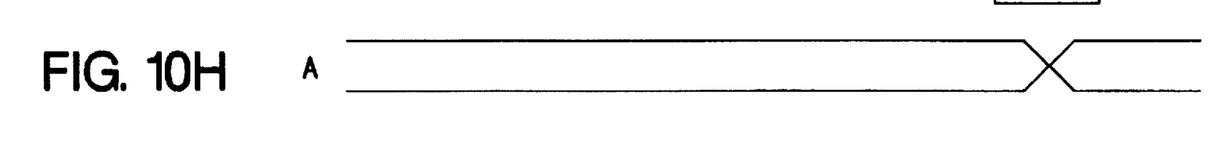

Referring to FIG. 9, in place of pipeline control circuit 15A of the first embodiment of FIG. 4, the semiconductor memory device of the second embodiment of the present invention has pipeline control circuit 15C which inputs sync-signal ICLK1, ICLK1D, and pipeline enable signal PEN2 and which outputs output R6OUT, and in place of sync-signal generation circuit 16A, has sync-signal generation circuit 16C which inputs R6OUT and outputs sync-signal ICLK2.

Pipeline control circuit 15C is made up of: NAND gate NA8 that inputs sync-signal ICLK1D and pipeline enable signal PEN2; flip-flop R4 composed of two NAND gates NA10 and NA11 that inputs the output of NAND gate NA8 and outputs R4OUT; NAND gate NA9 that inputs sync-signal ICLK1 and pipeline enable signal PEN2; flip-flop R5 composed of two NAND gates NA12 and NA13 that inputs the output of NAND gate NA9 and outputs R5OUT; NAND gate NA14 that inputs R4OUT and R5OUT; and flip-flop R6 composed of two NAND gates NA15 and NA16 that inputs the output of NAND gate NA8 as a set signal and the output of NAND gate NA14 as a reset signal and outputs R6OUT; flip-flops R4 and R5 being reset by the output of NAND gate NA14.

Further, sync-signal generation circuit 16C is made up of inverter IV1 that inputs the output R6OUT of pipeline control circuit 15C and outputs sync-signal ICLK2.

Next, the operation of this embodiment will be explained with reference to FIG. 10.

After pipeline enable signal PEN2 becomes high-level, sync-signal ICLK1D transits from low-level to high-level, whereupon the output R6OUT of flip-flop R6 is latched at high-level and sync-signal ICLK2 becomes low-level. On the other hand, when sync-signal ICLK1D and sync-signal ICLK1 transit from low-level to high-level, the output R3OUT of flip-flop R3 and the output R4OUT of flip-flop R4 are each latched at high-level and the output R6OUT of flip-flop R6 is then reset to low-level and sync-signal ICLK2 becomes high-level.

As for the embodiment shown in FIG. 4, when sync-signal ICLK2 becomes high-level, read data D1 is outputted from latch circuit 19 and reaches node B. As a result, if latch circuit 19 is a D-latch-type latch circuit, the amount of delay of delay element DL1 is adjusted at the time at which the data reach node A such that sync-signal ICLK2 is low-level as shown in FIG. 10A–10H.

As explained hereinabove, the minimum necessary time of a data transfer path is regulated by delay elements, and the slower of a sync-signal that regulates these delay elements and a sync-signal produced from the clock (CLK) is used as the pipeline control timing, and consequently, if the delay times of two delay elements DL1 and DL2 are optimized to minimize the cycle time (tCK3) of CAS latency =3, the cycle time (tCK2) of CAS latency=2 is also optimized, arid there is no need to optimize the delay times of each separate delay element for every CAS latency. The present invention therefore provides the effect of reducing the number of items to be considered in design as well as reducing items requiring adjustment when initiating use of a product.

Furthermore, in present and future development of products having a capability for CAS latency=4, optimizing the delay times of three delay elements to minimize the cycle time (tCK4) of CAS latency=4 also optimizes for cases in which CAS latency=3 and CAS latency=2, thereby providing a still greater effect with a semiconductor memory device of higher speeds.

While preferred embodiments of the present invention have been described using specific terms, such description is for illustrative purposes only, and it is to be understood that changes and variations may be made without departing from the spirit or scope of the following claims.

What is claimed is:

1. A semiconductor memory device comprising at least:
   first sync-signal generation circuit means that generates and outputs a first sync-signal in synchronization with any of a first clock inputted from the outside and a second and third clock inputted following said first clock;
   first delay circuit means that delays said first sync-signal a prescribed time interval and outputs the result as a second sync-signal;
   first latch circuit means that latches said second sync-signal;
   second latch circuit means that latches said first sync-signal;
   and third latch circuit means that detects that said first and second latch circuit means both latch said second sync-signal and said first sync-signal, respectively, and latches this detection;
   wherein output of said third latch circuit means controls a pipeline circuit.

2. A semiconductor memory device according to claim 1 wherein said third latch circuit detects that said first and second latch circuit means both have latched said second sync-signal and said first sync-signal, respectively, and then is reset.

3. A semiconductor memory device according to claim 1 further comprising a first control signal generation circuit means that outputs a first control signal that is enabled after completion of generation of said first sync-signal, which is generated in synchronization with said first clock; wherein said first and second latch circuit means respectively latch second and first sync-signals only after said first control signal is enabled.

4. A semiconductor memory device according to claim 1 further comprising:
   second delay circuit means that delays by a prescribed time interval output of said third latch circuit means and outputs the result as a third sync-signal;
   fourth latch circuit means that latches said third sync-signal;

fifth latch circuit means that latches said first sync-signal that is generated in synchronization with said third clock; and sixth latch circuit means that detects that said fourth and fifth latch circuit means both have latched said third sync-signal and said first sync-signal, respectively, and latches this detection;

wherein output of said sixth latch circuit means controls a pipeline circuit.

5. A semiconductor memory device according to claim 4 wherein said sixth latch circuit means detects that said fourth and fifth latch circuit means both have latched said third sync-signal and said first sync-signal, respectively, and then is reset.

6. A semiconductor memory device according to claim 4 further comprising second control signal generation circuit means that outputs a second control signal that is enabled after completion of generation of said first sync-signal, which is generated in synchronization with said second clock; wherein said fourth and fifth latch circuit means respectively latch said third and said first sync-signals only after said second control signal is enabled.

7. A semiconductor memory device according to claim 4 comprising logic that, through operation mode, maintains said second or fourth latch circuit means in the same state as generated by the sync-signal of the preceding stage.

8. A semiconductor memory device according to claim 1 wherein latches of said first and second latch circuit means are reset by output of said third latch circuit means.

9. A semiconductor memory device according to claim 4 wherein latches of said fourth and fifth latch circuit means are reset by output of said sixth latch circuit means.

10. A semiconductor memory device according to claim 1 further comprising second sync-signal generation circuit means that inputs output of said third latch circuit means and generates a fourth sync-signal, wherein said fourth sync-signal controls a pipeline circuit and resets latches of said third latch circuit means.

11. A semiconductor memory device according to claim 4 further comprising third sync-signal generation circuit means that inputs output of said sixth latch circuit means and generates a fifth sync-signal, wherein this fifth sync-signal controls a pipeline circuit and resets latches of said sixth latch circuit means.

12. A semiconductor memory device according to claim 2 further comprising a first control signal generation circuit means that outputs a first control signal that is enabled after completion of generation of said first sync-signal, which is generated in synchronization with said first clock; wherein said first and second latch circuit means respectively latch second and first sync-signals only after said first control signal is enabled.

* * * * *